United States Patent [19]

Harris

[11] Patent Number: 4,461,659
[45] Date of Patent: Jul. 24, 1984

[54] HIGH DUCTILITY NICKEL ALLOY DIRECTIONAL CASTING OF PARTS FOR HIGH TEMPERATURE AND STRESS OPERATION

[75] Inventor: Kenneth Harris, Spring Lake, Mich.

[73] Assignee: Cannon-Muskegon Corporation, Muskegon, Mich.

[21] Appl. No.: 276,890

[22] Filed: Jun. 24, 1981

Related U.S. Application Data

[63] Continuation-in-part of Ser. No. 113,037, Jan. 17, 1980, abandoned.

[51] Int. Cl.³ .............................................. C22C 19/05
[52] U.S. Cl. .................................... 148/404; 148/410; 148/428
[58] Field of Search .................... 75/171, 170; 148/32, 148/32.5

[56] References Cited

U.S. PATENT DOCUMENTS 3,720,509  3/1973  Danesi et al. .................... 75/171

Primary Examiner—R. Dean
Attorney, Agent, or Firm—Price, Heneveld, Huizenga & Cooper

[57] ABSTRACT

An improved alloy for use in directional solidification casting is disclosed in which the proportions of carbon, zirconium, tungsten and molybdenum have been changed to produce a new ultra high strength casting alloy free of the problem of grain boundary cracking which has been encountered in the production of directional solidification castings of this type of alloy and to minimize $M_6C$ plate phase formation in turbine blades under high temperature conditions over extended operating periods. In addition there is disclosed the unexpected characteristic of the alloy's substantial increase in fracture toughness and tensile ductility under extreme operating conditions.

8 Claims, 18 Drawing Figures

─── FIG. 3 ───
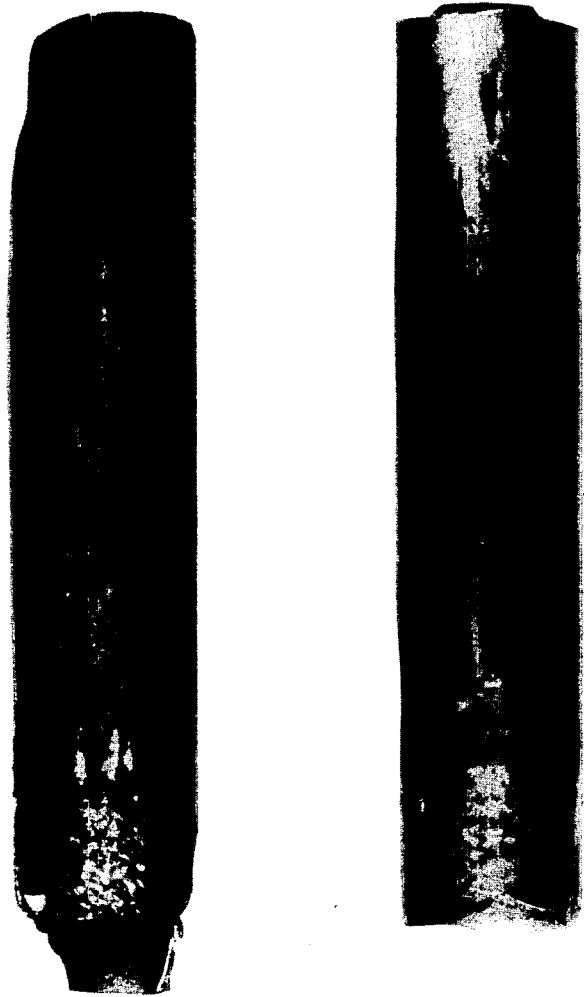
VE 930     VF 165

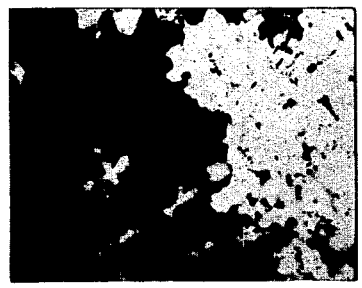
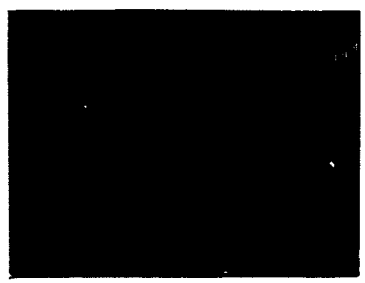
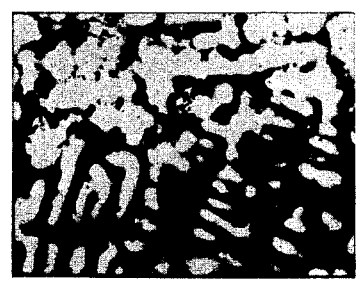
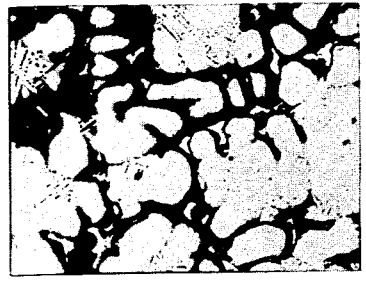
FIG. 7

X100 X400
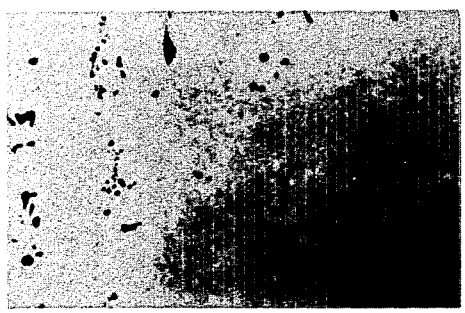 
850° C
(1560° F)
X100 X400
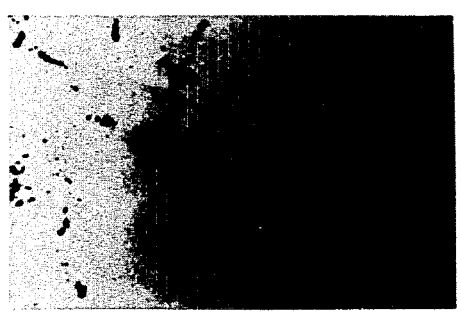 
950° C
(1740° F)
X100 X400
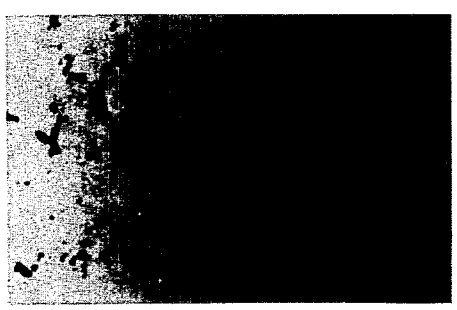 
1050° C
(1920° F)
FIG. 13

X100 X400
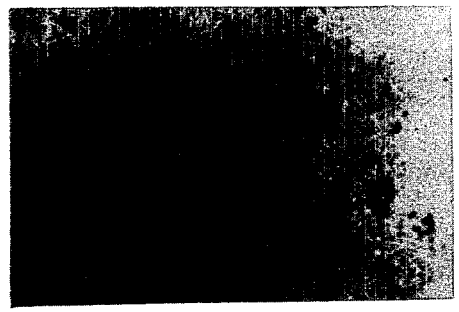
850° C
(1560° F)
X100 X400
950° C
(1740° F)
X100 X400
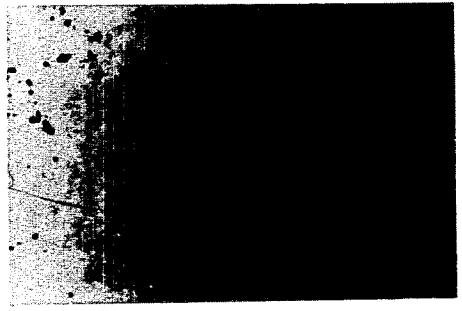
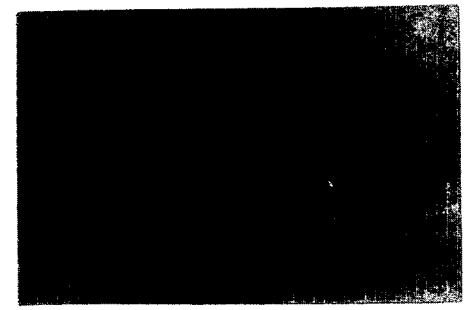
1050° C
(1920° F)
FIG.14

X100      X400
 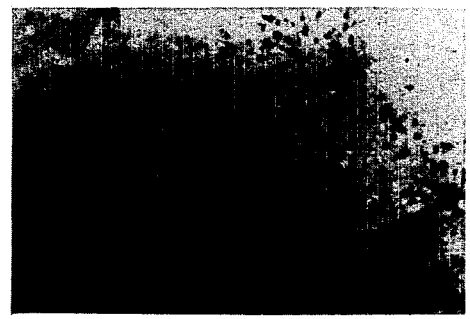
850° C
(1560° F)
X100      X400
 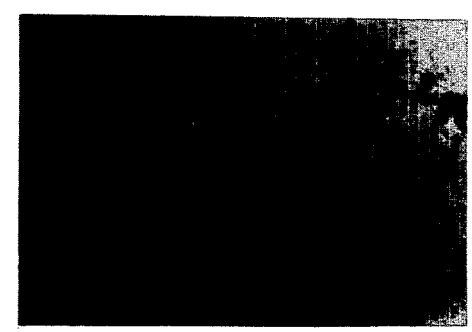
950° C
(1740° F)
X100      X400
 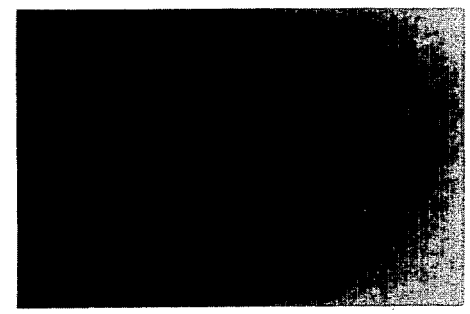
1050° C
(1920° F)
FIG. 15

X100　　　　X400
850° C
(1560° F)
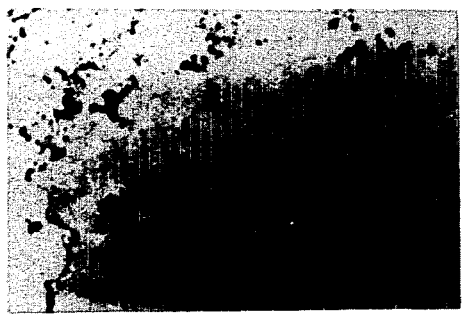 
X100　　　　X400
950° C
(1740° F)
 
X100　　　　X400
1050° C
(1920° F)
 
FIG.16

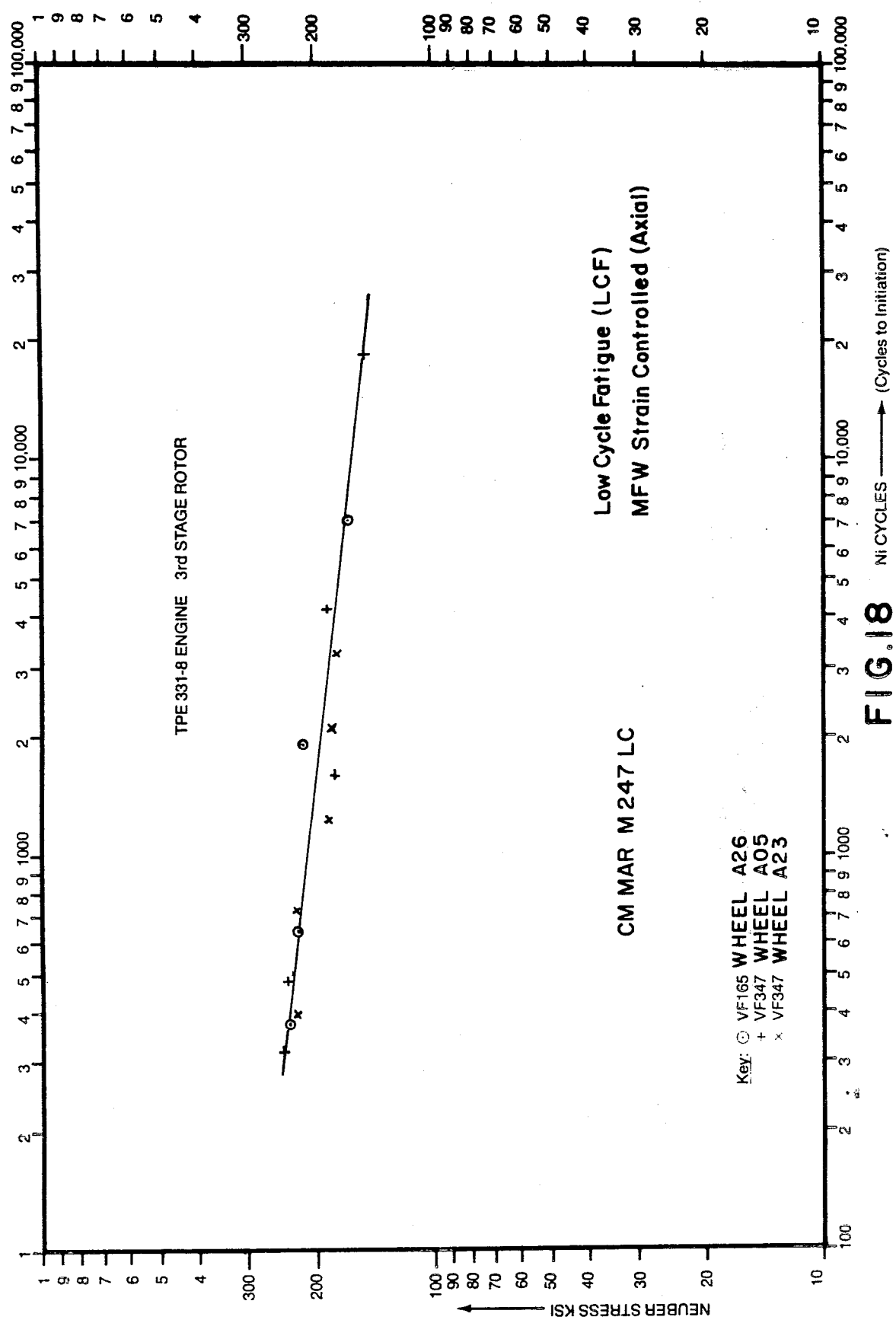

HIGH DUCTILITY NICKEL ALLOY DIRECTIONAL CASTING OF PARTS FOR HIGH TEMPERATURE AND STRESS OPERATION

This application is a continuation-in-part of co-pending application Ser. No. 113,037 filed Jan. 17, 1980, entitled "Directional Cast Alloy For High Temperature Operation", now abandoned.

BACKGROUND OF THE INVENTION

The invention is in the field of nickel-base super alloys for casting particularly intended for vacuum casting, by directional solidification, of thin wall products of complex shape design for use under extremely demanding service conditions. Particularly is the alloy of this invention intended for use in the casting of turbine blades and vanes for jet engines where the castings will be subjected to extended periods of operation under very high temperatures. For some time equiaxed grain castings were used for such parts. However, these proved unsatisfactory as the operating conditions for the castings became more severe. In response to these problems the gas turbine industry developed the technique of directional solidification (referred to as DS) with significant improvement in high temperature alloy properties and blade performance. However, parts cast by this technique are susceptible to grain boundary cracking.

Designs to increase the power and efficiency of gas turbine engines have required reduction of the wall section of such turbine blade castings to improve blade cooling efficiency. This necessitates the use of special, high strength, cast alloys. Extremely thin wall sections are required to provide rapid thermal transfer because the blades may be operating in a gaseous environment temperature above the melting point of the alloy. In such an environment it is critical to provide sufficiently rapid heat transfer to assure the actual temperature of the blades being kept below that at which they lose structural integrity. As the wall thickness of the blades has been decreased, the strength of the alloys has had to be increased. However, as the strength of the alloy has been increased, the problem of grain boundary cracking during DS casting of the blades has also increased. The response to this has been the development of improved alloys such as those disclosed in U.S. Pat. Nos. 3,526,499 entitled "Nickel Base Alloy Having Improved Stress Rupture Properties" issued Sept. 1, 1970 to R. J. Quigg et al, and 3,677,747 entitled "High Temperature Castable Alloys and Castings" issued July 18, 1972 to C. H. Lund et al and 3,720,509 entitled "Nickel Base Alloy" issued Mar. 13, 1973 to W. P. Danesi et al. Despite these improvements in ultra high strength alloys suitable for directional solidification, grain boundary cracking has continued to be a problem. This invention provides an alloy with a very significant improvement in the elimination of grain boundary cracking.

It has now been found that the super alloy of this invention, due to heretofore undiscovered characteristics of the alloy and of castings made from the alloy, provides a major solution to the problem of lack of tensile ductility and fracture toughness of highly stressed castings utilized under high temperature conditions such as equiaxe, integrally cast, turbine engine wheels. It has been discovered that the changes in the alloy composition over that of related, prior art alloys of the same general type produces a change in carbide morphology, which is a change in shape, as well as in quantity. This change in carbide morphology was unexpected and, until recently, undiscovered.

BRIEF DESCRIPTION OF THE DRAWINGS

FIG. 3 is a photograph of a pair of castings made using the test device of FIGS. 1 and 2;

FIG. 7 is a group of 50× microphotos of etched test specimens at the locations indicated in FIG. 4 showing the change in carbide morphology resulting from the formulation of the alloy of this invention;

FIG. 13 is a group of microphotos of polished and etched MFB test specimens from DS as-cast blades of C M Mar M 247 LC (heat VF-165) showing the change in carbide microstructure at 100× and 400× during 1000 hours of aging as the aging temperature increases;

FIG. 14 is a group of microphotos of polished and etched MFB test specimens from DS as-cast blades of C M Mar M 247 LC (heat VF-165) showing the change in carbide microstructure at 100× and 400× during 3000 hours of aging as the aging temperature increases;

FIG. 15 is a group of microphotos of polished and etched MFB test specimens from DS cast blades of C M Mar M 247 LC (heat VF-165) which had been solution treated for two hours at 2230° F. followed by a gas fan quench showing the change in carbide microstructure at 100× and 400× during 1000 hours of aging as the aging temperature increases;

FIG. 16 is a group of microphotos of polished and etched MFB test specimens from DS cast blades of C M Mar M 247 LC (heat VF-165) which had been solution treated for two hours at 2230° F. followed by a gas fan quench showing the change in carbide microstructure at 100× and 400× during 3000 hours of aging as the aging temperature increases;

FIG. 18 is a graph plotting the results of Low Cycle Fatigue tests conducted on the alloy of this invention.

DESCRIPTION OF THE INVENTION

Figure 1:
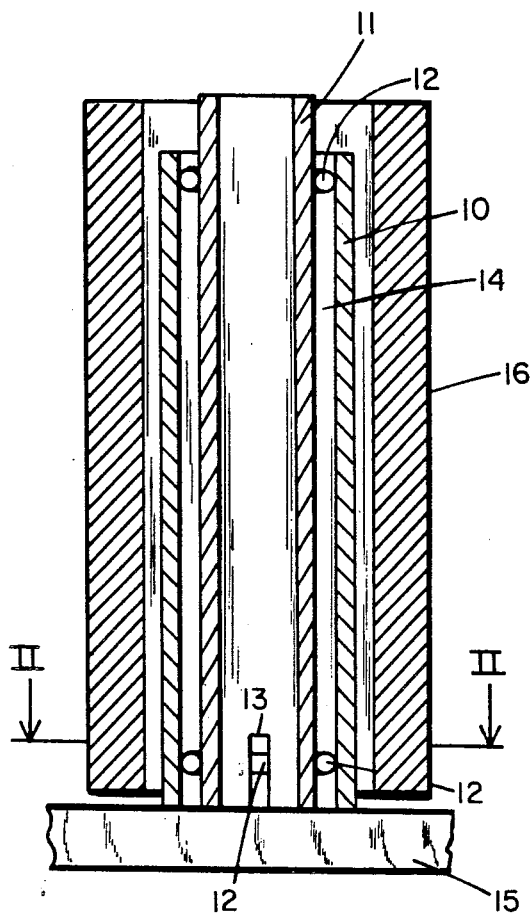
FIG. 1 is a partially schematic, sectional elevational view of a test device for determining susceptibility to grain boundary cracking.

After a long period of investigation and experimentation, it has been learned that by reducing the maximum amount of carbon, zirconium, tungsten and molybdenum, the problem of grain boundary cracking can be significantly reduced or eliminated, without significant sacrifice of strength and at the same time substantially eliminating the formation of $M_6C$ (where M is tungsten (W) and molybdenum (Mo)) carbide plates under subsequent operating conditions. Platelet phase formation in cast turbine blades is undesirable since the platelets act as nucleants for forming premature cracks due to fatigue and also act as preferential high propagation rate crack paths.

The problem of grain boundary cracking has been particularly evident in the thin wall, first stage turbine blade and vane designs for advanced turbine engines. The blades have a wall thickness of 0.025-0.030 inches with very complex coring and a high core to metal volume ratio. This type of casting requires a very high strength alloy. This type of casting has been impractical to manufacture from some existing alloys with the required high temperature strength because of potential failure resulting from grain boundary cracking occurring during the DS casting of the parts. Despite this problem, such alloys have been used because nothing better was known and thus there was nothing to substitute for these alloys. This is a very serious problem in high performance turbine blades and vanes. The operating conditions are such that structural failure is intolerable. Thus, complete and thorough inspection of each part is required. Because of the intricacy of the designs and the minuteness of the passages, these parts can only be inspected internally by suitable probes inserted through each passage, and even then the inspector is frequently required to exercise a high degree of judgement as to whether what is seen through the probe is in fact a crack. This is very time consuming and expensive, especially when reject rates involve a substantial percentage of the total castings poured.

It is another important facet of this invention that the alloy remain metallurgically stable under the severe temperature and stress of its operating environment. The fact that this alloy is stable and will develop minimum, if any, plates of $M_6C$ is shown by its chemistry. In this alloy the M is mainly W and Mo. While the presence of W and Mo increases the tendency to formation of the plate $M_6C$ carbide phase from high temperature/stress decomposition of the script-like titanium carbides (TiC) phase, these elements along with tantalum (Ta) cannot be eliminated because of their essential role in strengthening at high temperatures. A low value for $\overline{N}_{v3B}$ is indicative that no deleterious sigma phase formation will occur. The reduction in C is important in accomplishing the minimized $M_6C$ plate phase formation by reducing the initial, as-cast formation of interdendritic script-like titanium carbides (TiC). The TiC are the least stable of those which can form in the alloy. The fact that the amount of C could be reduced while improving alloy characteristics is significant because C, while essential to the formation of interdendritic and grain boundary carbides, is essential to the grain boundary strength and stability of the alloy. In the development of this alloy, it was discovered that zirconium (Zr), a known source of increased alloy creep strength, was also a causative of grain boundary crack sensitivity, although the reason for this is not fully understood. It is known that zirconium Zr migrates to the grain boundaries in these cast nickel-base alloys. Even very minor changes in the percentage of Zr present were found to produce significant changes in alloy DS castability. It is also important to keep the sulphur (S) at extremely low levels [<20 ppm] in this modified alloy. S migrates to the grain boundary and causes a significant reduction in grain boundary strength and ductility.

The objectives of this invention include not only virtual or total elimination of the grain boundary cracking problem without unacceptable sacrifice of high temperature strength, but also an alloy having dependable repeatability under commercially acceptable manufacturing and foundry use conditions.

As a result of experimentation to determine the utility of the alloy of this invention for casting products other than the DS cast turbine blades, it was discovered that high performance turbine wheels could be integrally cast from this alloy with outstanding improvement in operating characteristics. It was found that integral turbine wheels equiaxe cast from this alloy had unusually high tensile ductility resulting in good low cycle fatigue (LCF) and fracture toughness properties. The integral turbine wheels cast from this alloy are of the type specifically designed for first stage operation where the extreme operating conditions also make them particularly LCF sensitive. Evaluation of these wheel castings established that they had almost double the tensile ductility of castings made from the alloys disclosed in any of the patents previously noted. In testing the wheel castings using machined from wheel (MFW) test specimens to determine the cause for this unexpected increase in ductility, the serendipitous discovery was made that this alloy produced a carbide morphology change which is a change in shape (blocky carbides rather than script-like) as well as the expected change in quantity, giving the castings unexpected characteristics.

The alloy of this invention is tabulated in the following Table I.

TABLE I

| | |
|---|---|
| C | .07–.09 |
| Si | .03 max. |
| Mn | .10 max. |
| P | .005 max. |
| S | 20 ppm max. |
| Cr | 7.5–8.5 |
| Co | 9.0–9.5 |
| Mo | 0.4–0.6 |
| W | 9.3–9.7 |
| Ti | 0.6–0.9 |
| Al | 5.4–5.7 |

TABLE I-continued

| | |
|---|---|
| Ta | 3.1–3.3 |
| Hf | 1.4–1.6 |
| B | 0.01–0.02 |
| Zr | .007–.015 |
| Fe | .2 max. |
| Cu | .05 max. |
| Cb | .10 max. |
| Mg | 80 ppm max. |
| Pb | 2 ppm max. |
| Se | 1.0 ppm max. |
| Bi | .3 ppm max. |
| Te | .5 ppm max. |
| Tl | .5 ppm max. |
| [N] ppm | 15 max. |
| [O] ppm | 10 max. |
| $N_{\gamma3B}$ | 2.15 max. |
| Ni | Balance |

A specific composition for the alloy of this invention (C M Mar M 247 LC) is tabulated in Column A of Table II. In this tabulation it is compared with a commercially used alloy utilizing the teachings of U.S. Pat. No. 3,720,509, set out in Column B:

TABLE II

| | A | B |
|---|---|---|
| C | .08 | .13–.17 |
| Si | .03 max. | .15 max. |
| Mn | .10 max. | .20 |
| P | .005 max. | .015 max. |
| S | 20 ppm max. | 100 ppm max. |
| Cr | 8.0 | 8.00–8.80 |
| Co | 9.3 | 9.00–11.00 |
| Mo | .55 | .50–.80 |
| W | 9.5 | 9.50–10.50 |
| Ti | .7 | .90–1.20 |
| Al | 5.60 | 5.30–5.70 |
| Ta | 3.2 | 2.80–3.30 |
| Hf | 1.5 | 1.20–1.60 |
| B | .015 | .010–.020 |
| Zr | .01 | .03–.08 |
| Fe | .2 max. | .25 max. |
| Cu | .05 max. | .10 max. |
| Cb | .10 max. | .10 max. |
| Mg | 80 ppm max. | Not Recorded |
| Pb | 2 ppm max. | 5 ppm max. |
| Se | 1.0 ppm max. | 1 ppm max. |
| Bi | .3 ppm max. | .3 ppm max. |
| Te | .3 ppm max. | .5 ppm max. |
| Tl | .3 ppm max. | .5 ppm max. |
| [N] ppm | 15 max. | Not Recorded |
| [O] ppm | 10 max. | Not Recorded |
| $N_{\gamma3B}$ | 2.15 max. | Not Recorded |
| Ni | Balance | Balance |

EXAMPLE I

Figure 2:
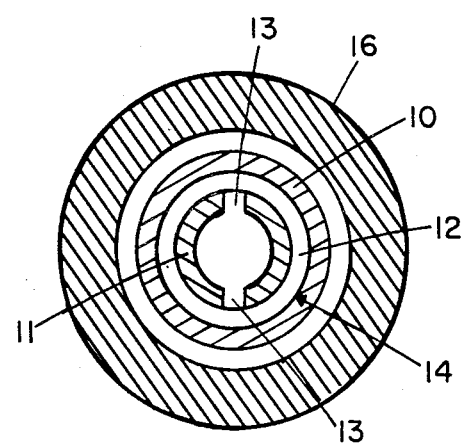
FIG. 2 is a sectional view taken along the plane II—II of FIG. 1.

A 250 pound heat No. VF-165 utilizing the Column A composition of Table II was manufactured by vacuum induction melting and was tested by vacuum DS casting it as a tube around an alumina core. The equipment for the test is illustrated in FIGS. 1 and 2.

This equipment includes an outer mold shell 10 and an inner tubular mold shell 11 of alumina. The shells were spaced apart at top and bottom and held in concentric relationship by spacer rings 12. Communication is provided between the interior of the inner shell and the annular space between the shells by a pair of vertical channels 13 at the bottom of the inner shell. In this particular test the radial spacing between the shells 10 and 11 forming the annular channel 14 was 0.15 mm and the O.D. of the shell 11 was 1.9 mm. The test unit was placed on a chill plate 15. The unit was surrounded by an induction heater 16. A rod of the alloy from heat VF-165 was placed within the inner shell 11. The induction heater was turned on to melt the alloy causing it to flow through the channels 13 into the annular space 14. After the annular channel was filled, the induction heater, while still activated, was gradually withdrawn upwardly. This procedure results in directional solidification of the alloy with a resulting vertical columnar grain structure, except at the bottom adjacent the chill plate 15 where some equiaxe solidification occurs. This can be seen in the photographs of FIG. 3.

Using the identical test equipment and procedure, a second tubular casting was made utilizing the alloy of the composition of Column B from heat No. VE-930.

The castings, after solidification and cooling to room temperature and removal of the other mold shell were inspected for evidence of cracks. As clearly appears on the left hand side of FIG. 3, numerous longitudinal cracks resulting from grain boundary cracking were observed in the casting made from the alloy set out in Column B of Table II. This cracking was observed to have occurred along grain boundaries entirely around the test castings. In contrast to this, the casting poured from the alloy composition of Column A of Table II showed no evidence of any cracking except some of about 0.5 mm in length at the extreme upper end and some in the equiaxe zone where little or no directional solidification occurred because of the effect of the chill plate 15.

This test is a particularly severe one for alloys susceptible to grain boundary cracking since it develops about a 2% plastic strain. Based upon a rating of A to F wherein:

A—no cracks apparent
B—only minor cracks at tips
C to E—progressively increasing severity of grain boundary cracking
F—gross grain boundary cracking The test casting from heat VF-165 (Column A, Table II) was rated A-B.

EXAMPLE II

Approximately 20 directionally solidified, complex cored, thin wall blades (hereinafter referred to as blades C) were vacuum cast from the alloy of the same heat (VF-165) as that tested in Example I. These were cast using a European developed, directional solidification, casting process. Identical blades (hereinafter referred to as blades D) were cast from heats V-5134 and V-5224 of the alloy set out in Column B of Table II, except for the following differences:

| | |
|---|---|
| Si | .10 max. |
| Mn | .10 max. |
| P | .010 max. |
| S | 20 ppm max. |
| Mg | 40 ppm max. |
| Pb | 2 ppm max. |
| [N] ppm | 10 max. |
| [O] ppm | 10 max. |

The blades cast from both alloys were aged by heat treating at 1600° F. for 20 hours. From the blades of both castings, test specimens of 0.089 inches diameter were machine cut and tested for stress-rupture with the following results:

Blades C

-continued

| LONGITUDINAL | Life Hours | Mean Life | Heat No. |
|---|---|---|---|
| 500 Mpa/850° C. [72.5 ksi/1560° F.] | 103, 100, 102 | [Mean 102] | VF-165 |
| 145 Mpa/1040° C. [21.0 ksi/1900° F.] | 42, 44, 49 | [Mean 45] | VF-165 |

| Blades D | | | |
|---|---|---|---|
| | Life Hours | Mean Life | Heat No. |
| LONGITUDINAL | | | |
| 500 MPa/850° C. [72.5 ksi/1560° F.] | 134, 143, 155 | [Mean 144] | V-5134 |
| | 115, 128, 120 | [Mean 121] | V-5224 |
| 145 MPa/850° C. [21.0 ksi/1900° F.] | 53, 55, 64 | [Mean 57] | V-5134 |
| | 47, 48, 55 | [Mean 50] | V-5224 |
| TRANSVERSE | | | |
| 465 MPa/850° C. [67.5 ksi/1560° F.] | 130, 138 | [Mean 134] | V-5134 V-5224 |
| 108 MPa/1040° C. [15.7 ksi/1900° F.] | 142, 189 | [Mean 165] | V-5134 V-5224 |

| Tensile Properties | | | |
|---|---|---|---|
| Blade | temp. | Tensile Strength ksi | % elongation |
| C | 1200° F. | 133 | 11.5 |
| D | 1200° F. | 124 | 6.4 |
| C | 1380° F. | 145 | 8.1 |
| D | 1380° F. | 136 | 5.5 |
| C | 1560° F. | 126 | 10.5 |
| D | 1560° F. | 125 | 6.9 |

In the case of all of these tests from which this data was compiled the test continued until failure by rupture occurred.

Careful examination of the blades C, including X-ray and fluorescent dye penetrant inspection, revealed no cracks in any of the blades. This is despite the fact that these blades were of a design considered to be "crack prone". These tests indicate that the alloy has overcome the problem of grain boundary cracking with improved tensile properties, particularly ductility, while retaining acceptable stress rupture properties.

The blades also were cut up and microscopically inspected for microporosity. The blades were found to have internal microporosity of not greater than 0.2% with most of the fields exhibiting a microporosity of about 0.1%. These performance capability results for the alloy of Column A are at least equal to those for the alloy of Column B while almost entirely eliminating part rejection because of grain boundary cracking and represent a substantial improvement over other conventional alloys which have been used for casting of high performance turbine blades.

While the objectives and thrust of the research while producing the alloy of this invention was the development of an improved alloy for DS casting, the following describes the unexpected characteristics of the alloy when used for certain types of equiaxe casting.

EXAMPLE III

Figure 5:
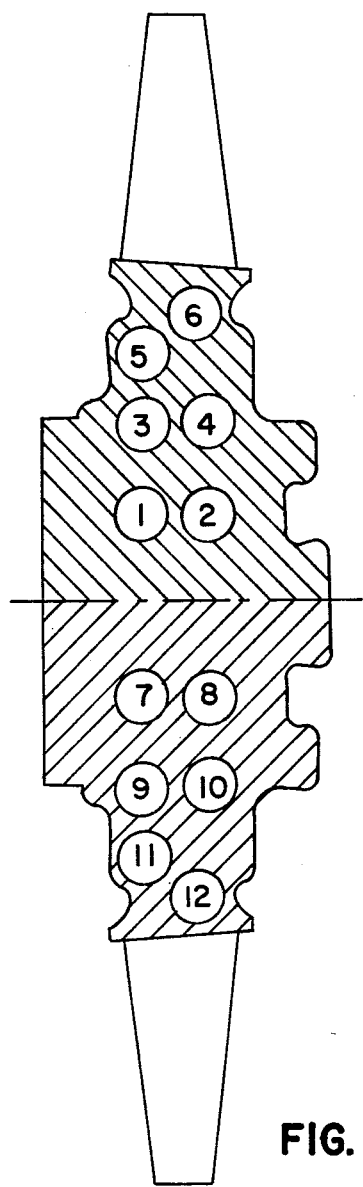
FIG. 5 is a schematic view of a test turbine wheel identifying the locations from which test bars were taken testing mechanical properties.
Figure 4:
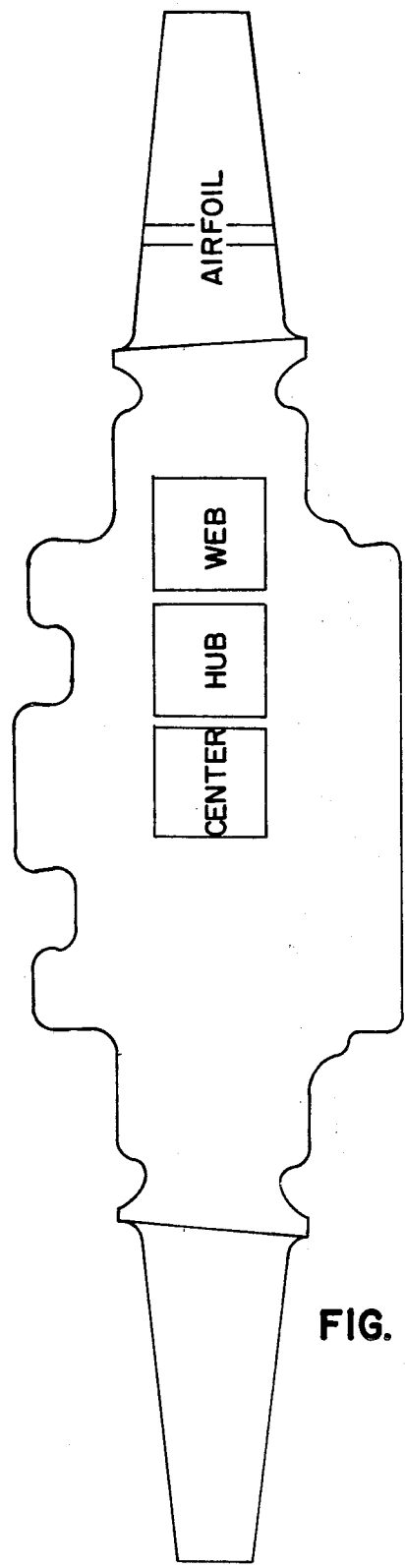
FIG. 4 is a schematic view of a test turbine wheel identifying the locations from which specimens were taken for microstructural analysis.

Four AiResearch TPE 331-8 Engine 3rd stage rotors or wheels were equiaxe cast by Howmet Turbine Components Corporation, two from Mar M 247 alloy (MM-0011) (standard chemistry-Col. 1 of Table III) (heat V-5722) and two from the low carbon alloy of this invention (heat VF-165). The composition of these heats is set out in Table III. Each wheel was heat treated 20 hours at 1600° F. One wheel from each heat was cut in half and one of the halves was sent to Howmet's Technical Center for microstructural evaluation and the other half was examined at Howmet's Austenal LaPorte Division for grain size and Zyglo surface defect testing. The locations from which the microstructural test samples were obtained is shown in FIG. 4. Mechanical property test bar specimens were taken from each of the two remaining wheels at the locations indicated in FIG. 5 and submitted to the Howmet Technical Center for testing.

TABLE III

| Element | Standard Heat (V-5722) | Low Carbon Heat (VF-165) |
|---|---|---|
| C | 0.148 | 0.074 |
| Si | <0.10 | <0.02 |
| Mn | <0.10 | <0.10 |
| S | 8 ppm | 8 ppm |
| Al | 5.58 | 5.6 |
| B | 0.014 | 0.016 |
| Bi (ppm) | <0.3 | <0.3 |
| Co | 10.0 | 9.5 |
| Cr | 8.2 | 8.0 |
| Fe | <0.10 | <0.10 |
| Hf | 1.4 | 1.4 |
| Mg (ppm) | <25 | <25 |
| Mo | 0.62 | 0.55 |
| Ni | Bal. | Bal. |
| Pb (ppm) | <1.0 | <0.5 |
| Se (ppm) | <0.5 | <0.5 |
| Ta | 3.2 | 3.3 |
| Te (ppm) | <0.3 | <0.3 |
| Ti | 1.0 | 0.7 |
| Tl (ppm) | <0.3 | <0.3 |
| W | 9.8 | 9.5 |
| Zr | 0.03 | 0.015 |

As a result of these tests it was found that the low carbon alloy of this invention, when used to cast the integral wheels using the equiaxe method of casting, exhibits an almost doubled tensile ductility, reduced microporosity, a lower density of carbides and a surprisingly high shift from script-type carbides to the blocky or discrete-type carbides, and also smaller gamma/-gamma prime eutectic nodules. This shift in carbide characteristics is particularly important in reducing the likelihood of crack initiation and high rate propagation. At 32 ksi/1800° F. the stress rupture properties were the same for both heats. The stress rupture life at 97.5 ksi/1400° F. was somewhat less for the low carbon alloy but considered acceptable. The results of the physical tests are summarized in the following Table IV.

TABLE IV

| Mechanical Test | Test Bar Location | Standard Chemistry S/N:A29 V-5722 | | | | | Low Carbon Chemistry S/N:A01 VF-165 | | | | |
|---|---|---|---|---|---|---|---|---|---|---|---|
| | | UTS KSI | YS KSI | LIFE | El % 4D | RA % | UTS KSI | YS KSI | LIFE | EL % 4D | RA % |
| 70° F. Tensile | 1 | 125 | 118 | — | 5.0 | 8.6 | 121 | 112 | — | 10.0 | 21.8 |
| | 2 | 125 | 120 | — | 4.0 | 11.6 | 118 | 112 | — | 10.0 | 21.0 |
| | 7 | 120 | 116 | — | 5.5 | 8.6 | *127 | 113 | — | 9.0 | 13.1 |
| | 8 | 123 | 117 | — | 5.3 | 8.6 | 122 | 115 | — | 10.0 | 13.1 |
| | 9 | 123 | 117 | — | 5.3 | 10.1 | 117 | 112 | — | 6.3 | 17.5 |

TABLE IV-continued

| Mechanical Test | Test Bar Location | Standard Chemistry S/N:A29 V-5722 | | | | | Low Carbon Chemistry S/N:A01 VF-165 | | | | |
|---|---|---|---|---|---|---|---|---|---|---|---|
| | | UTS KSI | YS KSI | LIFE | El % 4D | RA % | UTS KSI | YS KSI | LIFE | EL % 4D | RA % |
| | 10 | 123 | 118 | — | 3.6 | 9.3 | 121 | 114 | — | 6.6 | 11.6 |
| | Ave. | 123 | 118 | — | 4.8 | 9.5 | 121 | 113 | — | 8.7 | 16.4 |
| 800° F. Tensile | 3 | 124 | 114 | — | 4.7 | 8.6 | 122 | 109 | — | 8.9 | 11.6 |
| | 4 | 129 | 118 | — | 5.0 | 8.6 | 129 | 112 | — | 9.1 | 12.3 |
| | 11 | 129 | 117 | — | 4.5 | 7.6 | 122 | 111 | — | 7.8 | 17.5 |
| | 12 | 129 | 119 | — | 4.3 | 7.6 | 129 | 111 | — | 9.4 | 19.0 |
| | Ave. | 128 | 117 | — | 4.6 | 8.1 | 126 | 111 | — | 8.8 | 15.1 |
| 1400° F./97.5 KSI Stress Rupture | 5 | — | — | 131.3 | 5.0 | 12.4 | — | — | 91.0 | 4.5 | 7.6 |
| 1800° F./32.0 KSI Stress Rupture | 6 | — | — | 57.1 | 6.6 | 5.5 | — | — | 54.0 | 7.7 | 13.9 |

*Broke at Punch Mark

Figure 6:
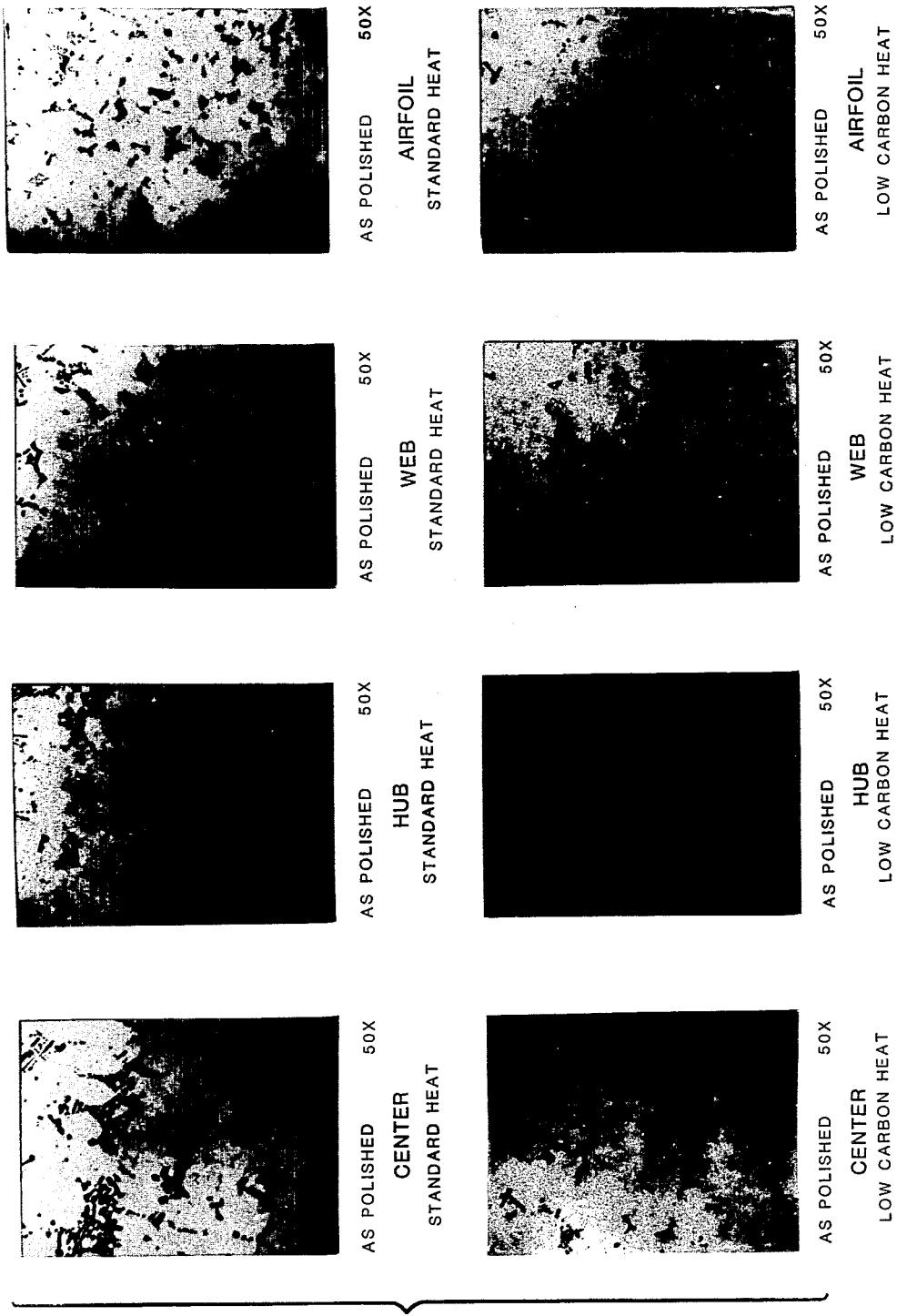
FIG. 6 is a group of 50× microphotos of polished test specimens at the locations indicated in FIG. 4 showing the change in carbide morphology resulting from the formulation of the alloy of this invention.

The results of the microstructural examination are shown in FIGS. 6 and 7. Each of the photos is identified as to the location from which the specimen was taken. The substantially nearly total shift from script carbides to blocky carbides is very pronounced as shown by the photos of FIG. 6 when the photos of the bottom row are compared with the corresponding photos in the upper row. This is confirmed by the photos appearing in FIG. 7 in which the appearance of the dendritic structure is made visible by etching.

Figure 8:
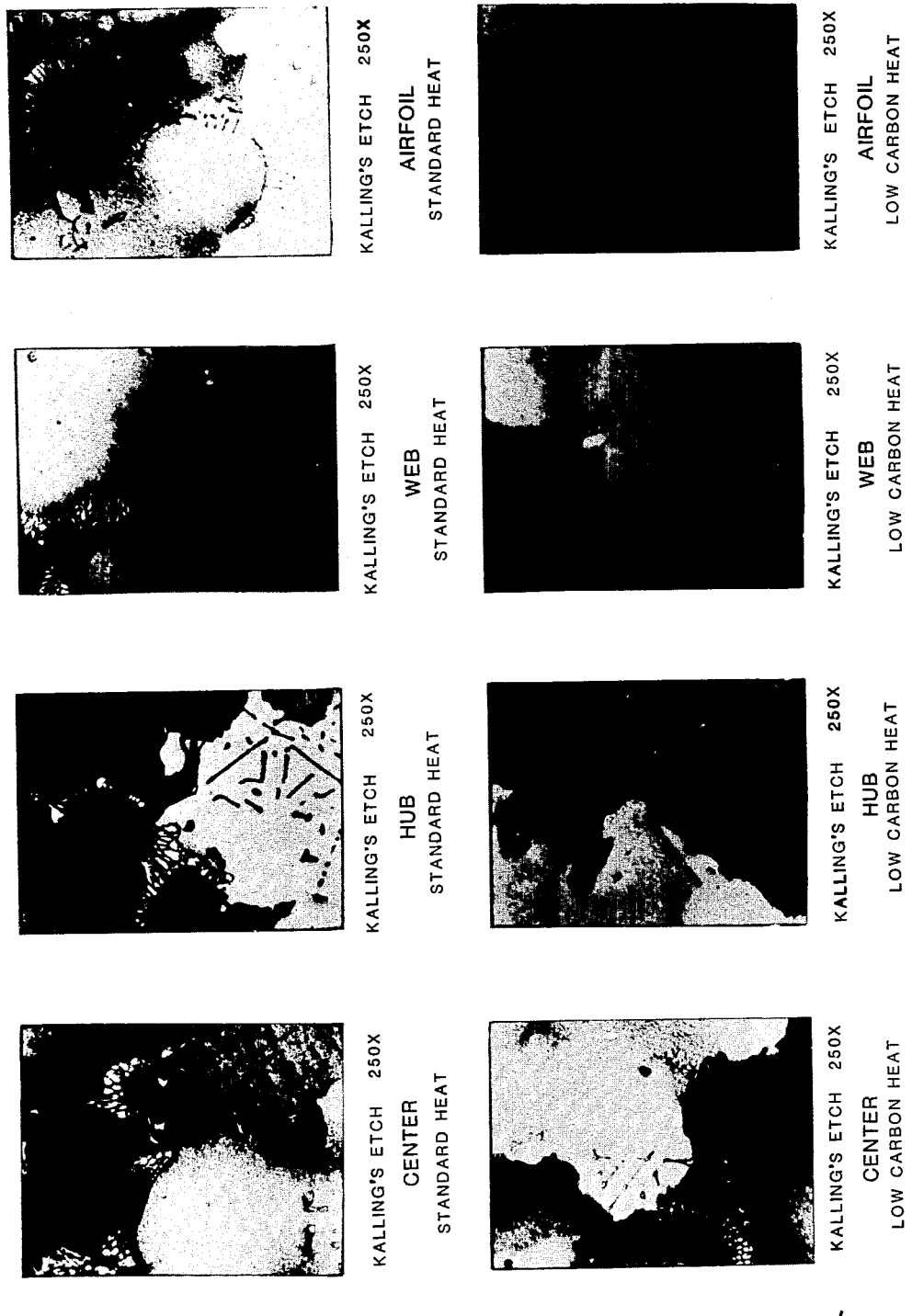
FIG. 8 is a group of 250× microphotos of the same test specimens as FIG. 6 showing the change in gamma/gamma prime eutectic nodules resulting from the formulation of the alloy of this invention.

The marked reduction in the size of the gamma/gamma prime nodules is also clearly seen in FIG. 8 where, by comparing the photos of the lower row with the corresponding photos of the upper row, there is a substantial size reduction in these nodules which appear as veined areas with a white background. This shift in eutectic nodule size is also believed to contribute to the unexpected magnitude of the change in ductility. It may also have increased the melting point of the alloy. However, this has not yet been ascertained.

Figure 17:
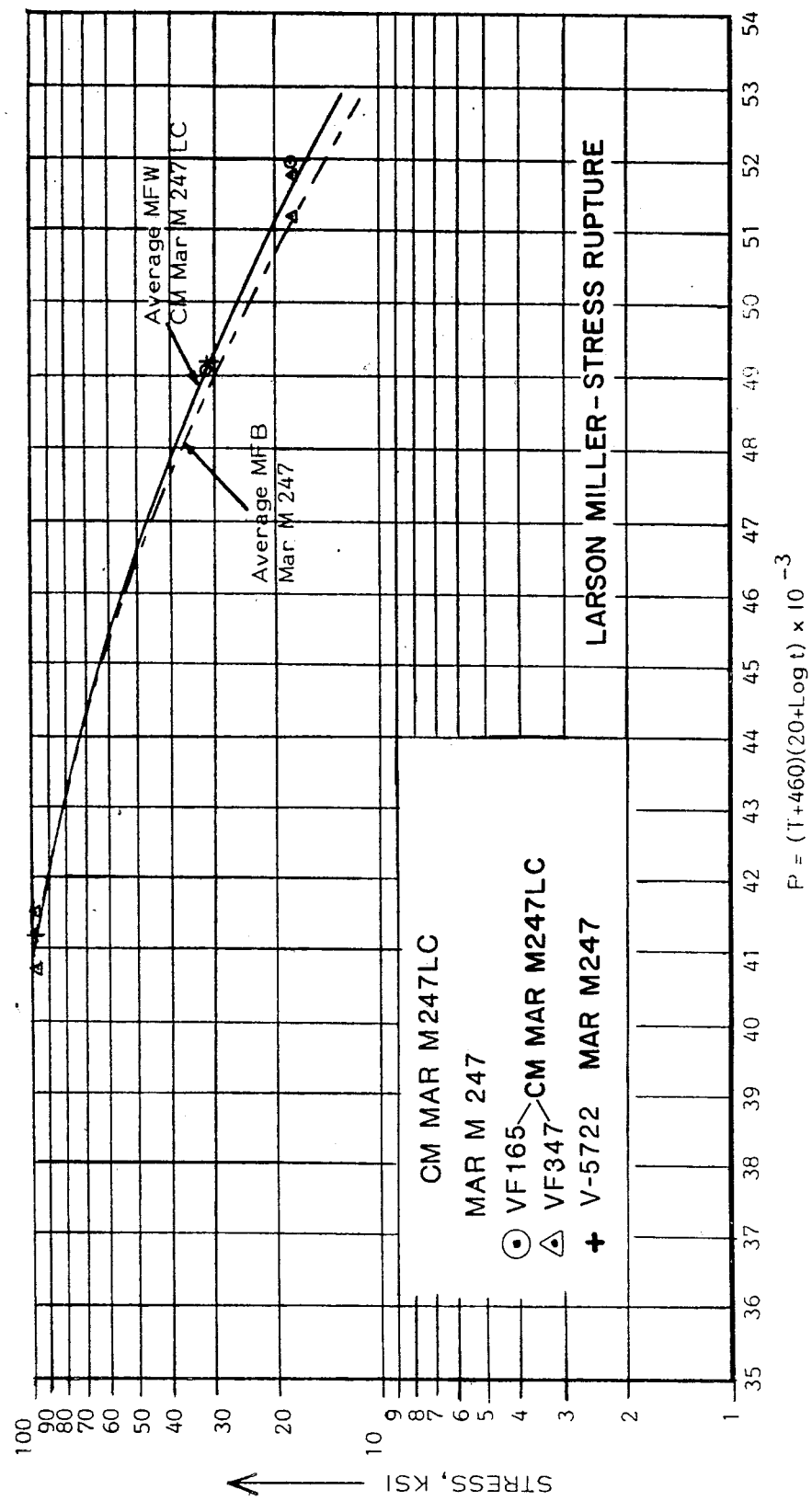
FIG. 17 is a graph of comparative stress rupture tests.

The result of comparative stress rupture tests is graphically set out in FIG. 17. The specimens of C M Mar M 247 LC were taken from castings made from both heats VF-165 and VF-347. The specimens were 0.187 inches and 0.250 inches diameter MFW, the wheel being as cast and aged 20 hours at 1600° F. and the stress-rupture life range was 50–1000 hours. The Mar M 247 were taken from castings made from CM heat V-5722. The specimens were 0.070 inch diameter machined-from-blade (MFB) (blade section 0.125 inches), the wheel being as cast and aged 20 hours at 1600° F. and the stress-rupture life range was 20–1300 hours. Seventy-four data points were generated which are summarized in FIG. 17.

The creep curves resulting from the tests show that all C M Mar M 247 LC specimens, particularly those tested at 1400° F. at 97.5 ksi failed in the tertiary creep region. This indicates low levels of microporosity in the wheels (as cast and aged condition), confirming the earlier metallographic studies where microporosity levels were found to be <0.5%. There is reason to believe that the difference in performance exhibited in FIG. 17 may have been due to the difference in specimen size rather than alloy characteristics and that in fact, so far as stress rupture is concerned, the two alloys are the same. This, however, is an unexpected result because the reduction of both C and Ti in Mar M 247 LC would be expected to reduce the creep rupture life of the alloy.

The TPE 331-8 Engine 3rd stage rotors of Example III were also tested for low cycle fatigue (LCF). These tests were conducted on smooth bar, MFW samples from three different wheels from two different heats (VF-165 and VF-347). The wheels were as-cast plus 20 hours aged at 1600° F., the test conditions were: 800° F. 20 CPM, A=∞ or R=1, α=7.7×10$^{-6}$/°F. The results of the tests are graphically illustrated in FIG. 18 and reveal a high degree of uniformity.

LCF tests on C M Mar M 247 LC and Mar M 247 show that both alloys exhibit a 50% improvement over existing superalloy wheel materials IN 100 and 713 LC in the same wheel configuration at 10,000 cycle life regime. While at low stress levels C M Mar M 247 LC has LCF properties similar to Mar M 247, C M Mar 247 LC exhibits an improvement over Mar M 247 in LCF capability at high stress levels.

Figure 9:
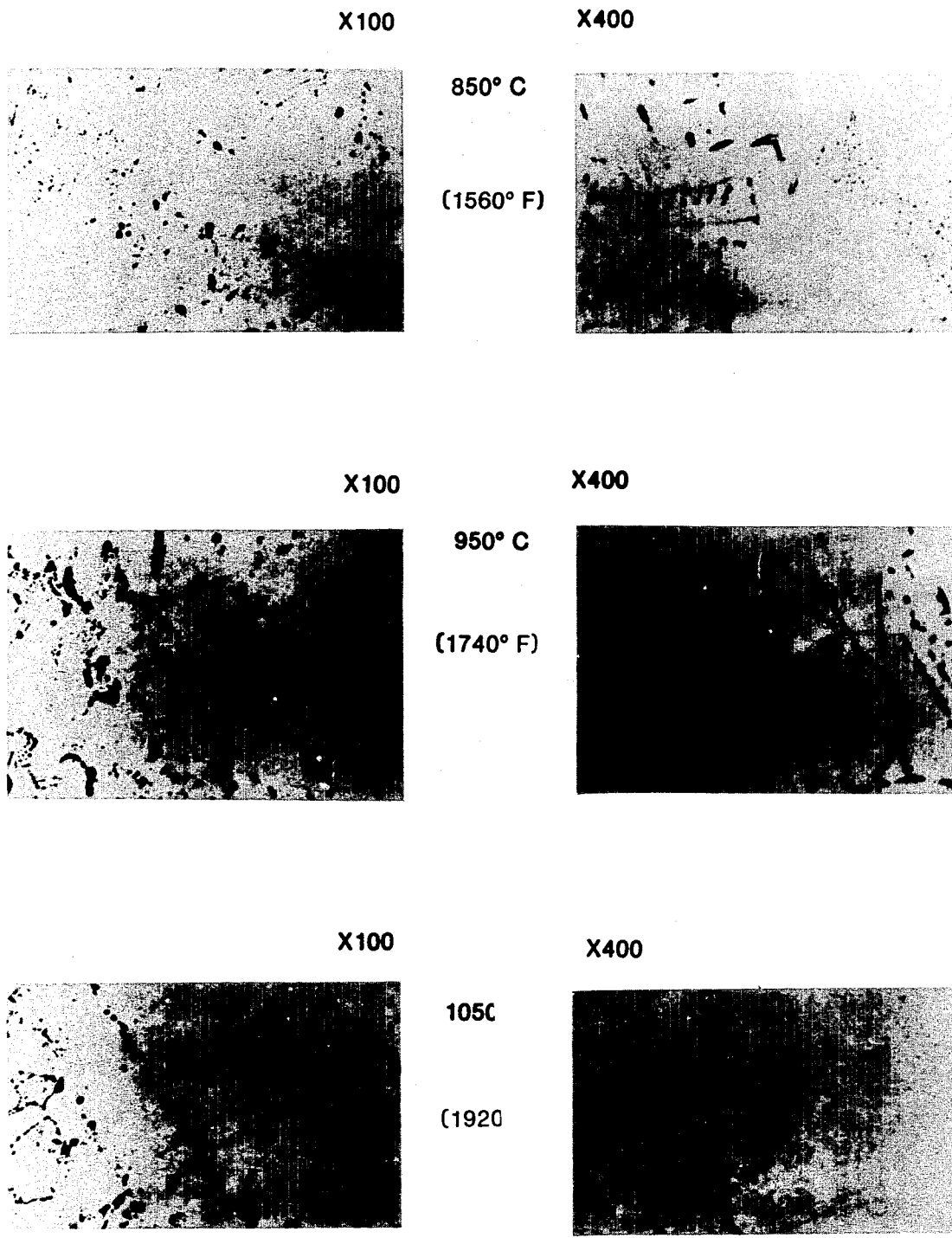
FIG. 9 is a group of microphotos of polished and etched MFB test specimens from DS as-cast blades of Mar M 247 (MM-0011) alloy (Col. 1 of Table III) (heat V-5224) showing the change in carbide microstructure at 100× and 400× during 1000 hours of aging as the aging temperature increases.
Figure 10:
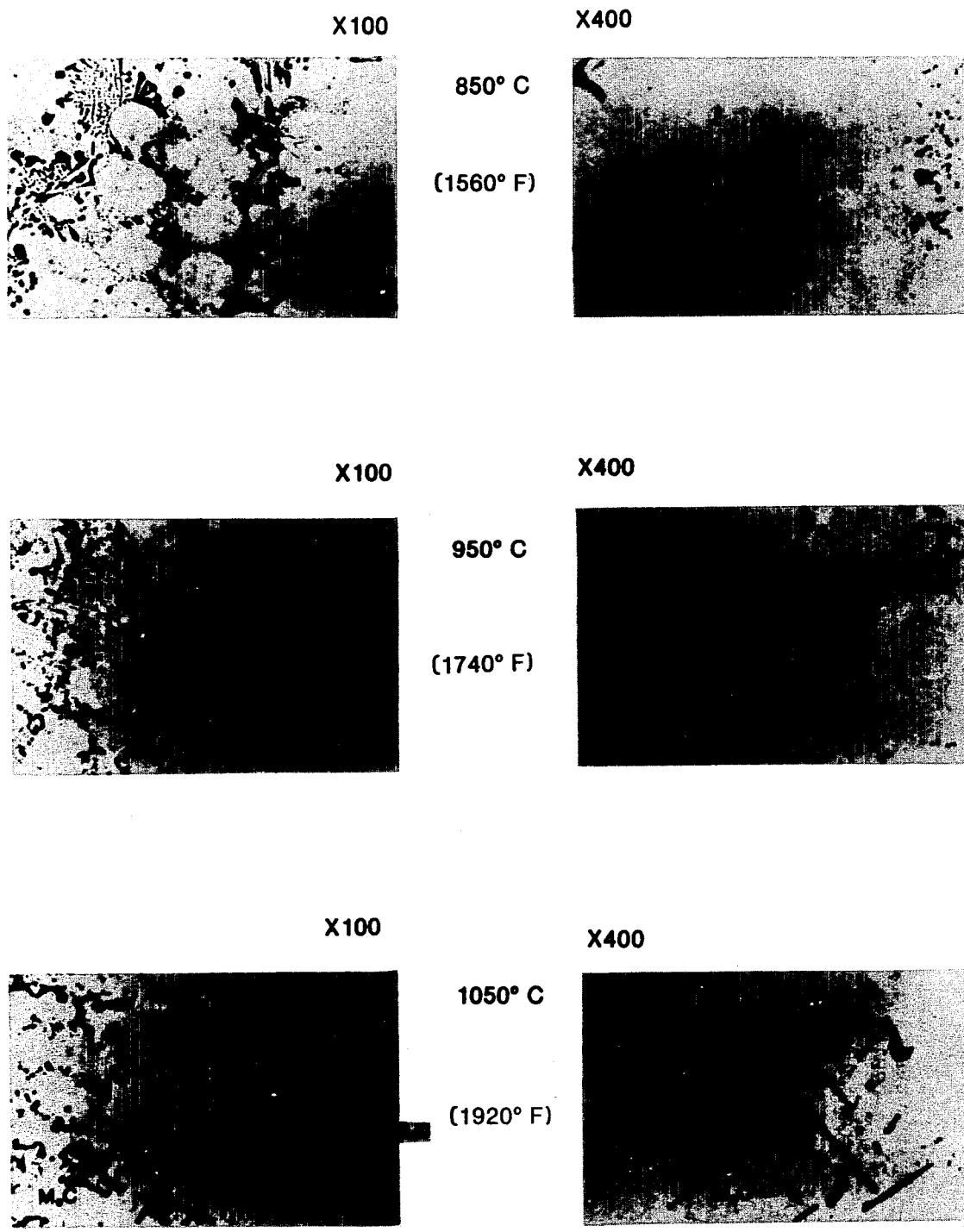
FIG. 10 is a group of microphotos of polished and etched MFB test specimens from DS as-cast blades of Mar M 247 (MM-0011) alloy (Col. 1 of Table III) (heat V-5224) showing the change in carbide microstructure at 100× and 400× during 3000 hours of aging as the aging temperature increases.
Figure 11:
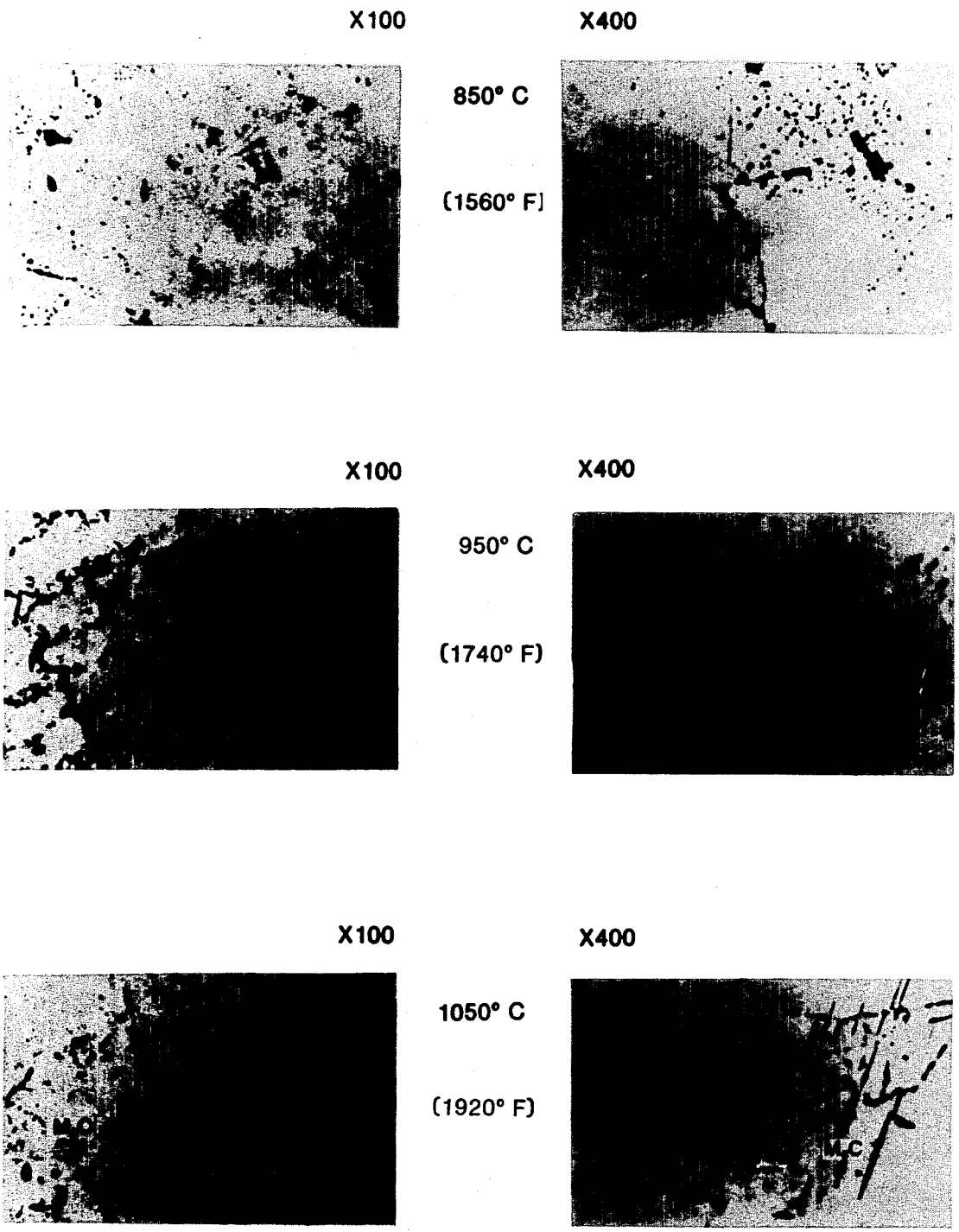
FIG. 11 is a group of microphotos of polished and etched MFB test specimens from DS cast blades of Mar M 247 (MM-0011) alloy (Col. 1 of Table III) (heat V-5224) which had been solution treated for two hours at 2230° F. followed by a gas fan quench showing the change in carbide microstructure at 100× and 400× during 1000 hours of aging as the aging temperature increases.
Figure 12:
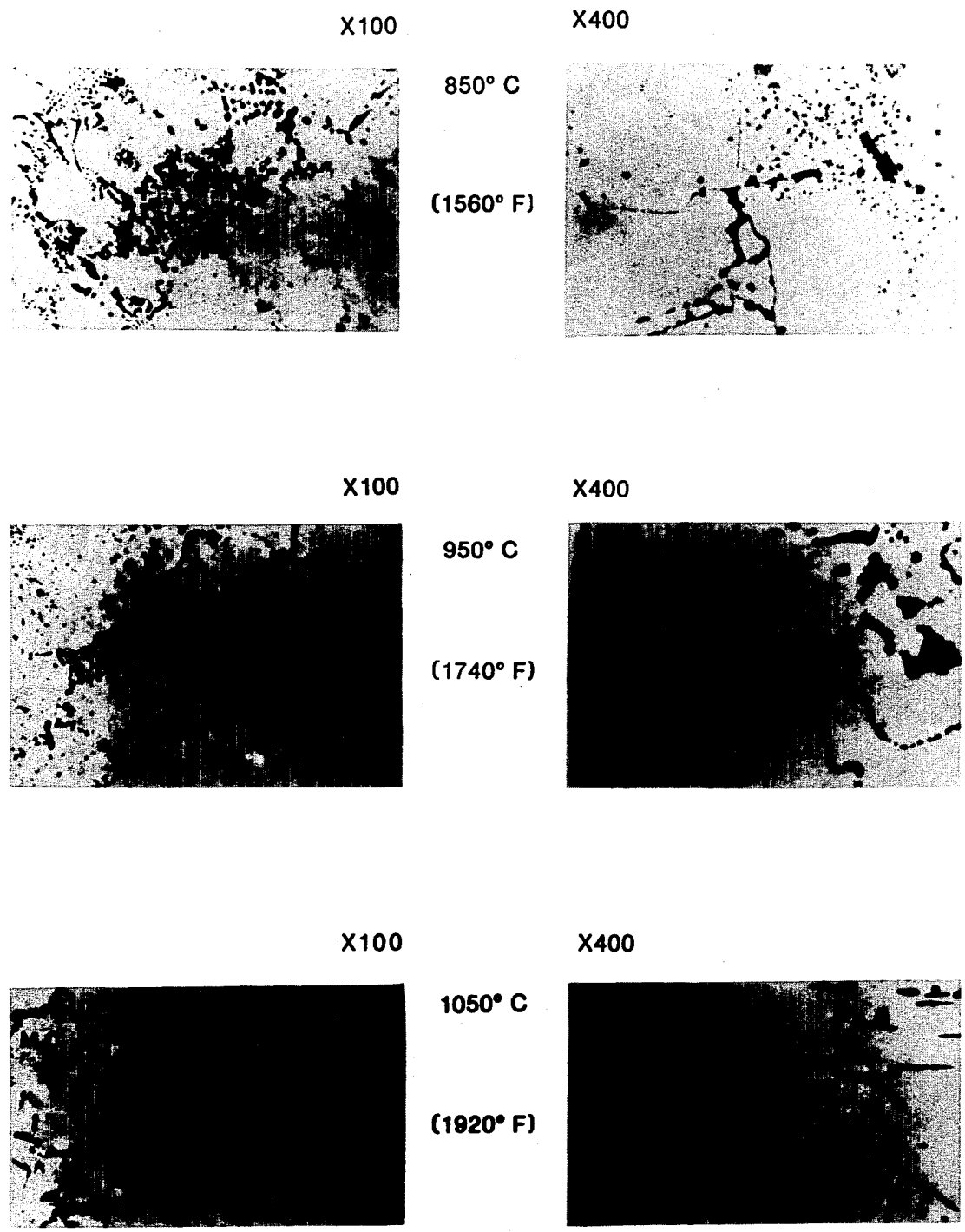
FIG. 12 is a group of microphotos of polished and etched MFB test specimens from DS cast blades of Mar M 247 (MM-0011) alloy (Col. 1 of Table III) (heat V-5224) which had been solution treated for two hours at 2230° F. followed by a gas fan quench showing the change in carbide microstructure at 100× and 400× during 3000 hours of aging as the aging temperature increases.

In addition, from a second heat of the low carbon (Mar M 247 LC) alloy (heat VF-329) equiaxe blade castings were made and tested for formation of mu, sigma and M$_6$C phases. Prior to testing, the blades are heat treated four hours at 1975° F. (pseudo coat) and then twenty hours at 1600° F. (age). Three tests were run on these blades:

2000 hours at 2000° F. soak
2000 hours at 1800° F. soak
2000 hours at 1600° F. soak In all cases no mu, sigma or M$_6$C were observed. The geometrics and chemistry of the carbides was stable, i.e., remaining blocky. Equiaxe castings utilizing the alloy of Column B of Table II had, in previous tests, exhibited some M$_6$C platelet formation with exposures of 1800° F. and 2000° F. It is clear from comparing FIGS. 9 and 10 with FIGS. 11 and 12 that the 2230° F. solution treatment significantly increases the M$_6$C platelet formation during 1920° F. unstressed exposure of castings made from Mar M 247. It is also known that stress will reduce the temperature required for M$_6$C formation from the 1920° F. to 1800° F.

FIGS. 13 through 16 clearly show the improvement in carbide microstructure realized when C M Mar M 247 LC is subjected to the same conditions as Mar M 247 as revealed in FIGS. 9 through 12. From a comparison of FIGS. 11 and 12 with FIGS. 15 and 16, respectively, it is clear that C M Mar M 247 LC is a marked improvement under a high temperature condition.

It has been concluded that this alloy may be suitable for hot isostatic press (HIP) processing where integral wheel configurations or fine grain casting techniques require this process step. This process, which is designed to conglomerate the casting by applying about 15 ksi pressure with argon gas at 2200° F.–2250° F. is designed to reduce microporosity, frequently has the effect of changing script carbides (TiC) to M₆C platelet formations upon subsequent 1800° F. stressed exposure in the blade areas of the castings. However, in view of the substantially total absence of initial script carbides, it is reasonably believed that the HIP process will not produce this adverse effect to any significant degree in C M Mar M 247 LC, whereas the problem is expected to occur with Mar M 247.

While the present invention has been described in detail and a particular embodiment has been set out as exemplary, those skilled in the art will recognize that modifications and variations may be resorted to which incorporate the teachings of the invention and such modifications and variations are to be considered to be within the purview and scope of the invention.

The embodiments of the invention in which an exclusive property or privilege is claimed are defined as follows:

1. A low carbon nickel base alloy directional solidified casting consisting essentially of the following elements:

| C | .07–.09 |
|---|---|
| Si | .03 max. |
| Mn | .10 max. |
| P | .005 max. |
| S | 20 ppm max. |
| Cr | 7.5–8.5 |
| Co | 9.0–9.5 |
| Mo | 0.4–0.6 |
| W | 9.3–9.7 |
| Ti | 0.6–0.9 |
| Al | 5.4–5.7 |
| Ta | 3.1–3.3 |
| Hf | 1.4–1.6 |
| B | 0.01–0.02 |
| Zr | .007–.015 |
| Fe | .2 max. |
| Cu | .05 max. |
| Cb | .10 max. |
| Mg | 80 ppm max. |
| Pb | 2 ppm max. |
| Se | 1.0 ppm max |
| Bi | .3 ppm max |
| Te | .5 ppm max |
| Tl | .5 ppm max |
| [N] ppm | 15 max. |
| [O] ppm | 10 max. |
| Nv3B | 2.15 max. |
| Ni | Balance. |

2. A vacuum cast, directionally solidified, thin wall, complex cored, high core-to-metal volume ratio casting for use under high stress, high temperature conditions, characterized by the absence of grain boundary cracking, cast from the alloy consisting essentially of the following elements:

| C | .07–.09 |
|---|---|
| SI | .03 max. |
| Mn | .10 max. |
| P | .005 max. |
| S | 20 ppm max. |
| Cr | 7.5–8.5 |
| Co | 9.0–9.5 |
| Mo | 0.4–0.6 |
| W | 9.3–9.7 |
| Ti | 0.6–0.9 |
| Al | 5.4–5.7 |
| Ta | 3.1–3.3 |
| Hf | 1.4–1.6 |
| B | 0.01–0.02 |
| Zr | .007–.02 |
| Fe | .2 max. |
| Cu | .05 max. |
| Cb | .10 max. |
| Mg | 80 ppm max. |
| Pb | 2 ppm max. |
| Se | 1.0 ppm max. |
| Bi | .3 ppm max. |
| Te | .3 ppm max. |
| Tl | .3 ppm max. |
| Ni | Balance. |

3. A turbine wheel blade or vane casting having thin walls and multiple internal channels particularly made and adapted for use under high stress, high temperature conditions and characterized by the absence of grain boundary cracking, vacuum cast and directionally solidified from the alloy consisting essentially of the following elements:

| C | .07–.09 |
|---|---|
| SI | .03 max. |
| Mn | .10 max. |
| P | .005 max. |
| S | 20 ppm max. |
| Cr | 7.5–8.5 |
| Co | 9.0–9.5 |
| Mo | 0.4–0.6 |
| W | 9.3–9.7 |
| Ti | 0.6–0.9 |
| Al | 5.4–5.7 |
| Ta | 3.1–3.3 |
| Hf | 1.4–1.6 |
| B | 0.01–0.02 |
| Zr | .007–.02 |
| Fe | .2 max. |
| Cu | .05 max. |
| Cb | .10 max. |
| Mg | 80 ppm max. |
| Pb | 2 ppm max. |
| Se | 1.0 ppm max. |
| Bi | .3 ppm max. |
| Te | .3 ppm max. |
| Tl | .3 ppm max. |
| Ni | Balance. |

4. A vacuum cast, directionally solidified, thin wall, complex cored, high core-to-metal volume ratio blade or vane for a turbine wheel for use under high stress, high temperature conditions, characterized by the absence of grain boundary cracking, cast from the alloy consisting essentially of the following elements:

| C | .07–.09 |
|---|---|
| SI | .03 max. |
| Mn | .10 max. |
| P | .005 max. |
| S | 20 ppm max. |
| Cr | 7.5–8.5 |
| Co | 9.0–9.5 |
| Mo | 0.4–0.6 |
| W | 9.3–9.7 |
| Ti | 0.6–0.9 |
| Al | 5.4–5.7 |
| Ta | 3.1–3.3 |
| Hf | 1.4–1.6 |
| B | 0.01–0.02 |
| Zr | .007–.02 |
| Fe | .2 max. |
| Cu | .05 max. |
| Cb | .10 max. |
| Mg | 80 ppm max. |

-continued

| | |
|---|---|
| Pb | 2 ppm max. |
| Se | 1.0 ppm max. |
| Bi | .3 ppm max. |
| Te | .3 ppm max. |
| Tl | .3 ppm max. |
| Ni | Balance. |

5. The casting described in claim 2 wherein the metallurgical stability factor of the alloy expressed by the formula $\overline{N}_{v3B}$ is 2.15 max.

6. The casting described in either claim 2 or 3 wherein the maximum of each of the elements nitrogen and oxygen is 15 parts per million and 10 parts per million, respectively.

7. A turbine engine blade consisting of the casting of claim 2 cast under vacuum.

8. A turbine engine blade consisting of the casting of claim 1 cast under vacuum.

* * * * *